United States Patent
Huang

(10) Patent No.: US 11,576,275 B2
(45) Date of Patent: Feb. 7, 2023

(54) DIN RAIL INSTALLATION KIT AND ITS OPERATION METHOD

(71) Applicant: ADLINK TECHNOLOGY INC., New Taipei (TW)

(72) Inventor: Chung-Liang Huang, New Taipei (TW)

(73) Assignee: ADLINK TECHNOLOGY INC., New Taipei (TW)

(*) Notice: Subject to any disclaimer, the term of this patent is extended or adjusted under 35 U.S.C. 154(b) by 163 days.

(21) Appl. No.: 17/186,996

(22) Filed: Feb. 26, 2021

(65) Prior Publication Data

US 2022/0279672 A1    Sep. 1, 2022

(51) Int. Cl.
*H05K 7/12* (2006.01)
*H05K 7/14* (2006.01)

(52) U.S. Cl.
CPC .......... *H05K 7/12* (2013.01); *H05K 7/1415* (2013.01); *H05K 7/1474* (2013.01)

(58) Field of Classification Search
CPC ....... H05K 7/12; H05K 7/1415; H05K 7/1474
See application file for complete search history.

(56) References Cited

U.S. PATENT DOCUMENTS

| | | | | |
|---|---|---|---|---|
| 5,904,592 A * | 5/1999 | Baran | .................... | H02B 1/052 361/627 |
| 6,292,076 B1 * | 9/2001 | DeGrazia | .............. | H02B 1/052 361/807 |
| 6,293,820 B1 * | 9/2001 | Bechaz | .................. | H02B 1/052 439/716 |
| 8,226,433 B1 * | 7/2012 | Correll | ................. | H01R 9/2608 439/532 |
| 10,390,449 B2 * | 8/2019 | Jiang | ..................... | H05K 5/0221 |
| 11,140,795 B2 * | 10/2021 | Gerving | ................ | H05K 7/023 |
| 11,234,515 B2 * | 2/2022 | Ofenloch | .............. | H02B 1/041 |
| 2009/0286422 A1 * | 11/2009 | Henkel | .................. | H02B 1/052 439/532 |
| 2016/0081215 A1 * | 3/2016 | Boretti | ................ | H05K 7/1401 248/221.11 |

FOREIGN PATENT DOCUMENTS

| EP | 3350667 A1 | * | 10/2019 |
|---|---|---|---|
| JP | 4111091 B | * | 7/2008 |
| JP | 4547636 B | * | 7/2008 |

* cited by examiner

*Primary Examiner* — Carl J Arbes
(74) *Attorney, Agent, or Firm* — Muncy, Geissler, Olds & Lowe, P.C.

(57) ABSTRACT

DIN rail installation kit including main body, spring hook, latch fastener and elastic element and combined with electronic device. When latch fastener is pulled down first to move to second position, buckle of latch fastener pushes down on hook body of spring hook, and after passing under hook body, hook end of hook body can be temporarily positioned on side wall of latch fastener. When user releases latch fastener, elastic element returns latch fastener, buckle is then buckled on buckle portion of hook body, and second buckle means of latch fastener is kept away from first buckle means of main body to present a removable state. When latch fastener is pulled down secondarily to return to first position, buckle is separated from buckle portion of hook body, and second buckle means and first buckle means are relatively buckled on DIN rail to exhibit a state of tight coupling.

12 Claims, 15 Drawing Sheets

When the user pulls down the latch fastener for the first time to move from the first position to the second position, the buckle will push down on the buckle portion of the hook body under the spring hook and deflect the hook body toward the adjacent side wall of the latch fastener, and when the buckle passes the buckle portion, the spring hook will automatically rebound so that the hook end of the hook body is temporarily positioned on the adjacent side wall. —S101

When the user releases the latch fastener and uses the elastic element to drive it upward, the buckle will be buckled on the buckle portion of the hook body, and the second buckle means of the latch fastener will be kept away from the first buckle means of the main body, and the DIN rail installation kit will be detachable. —S102

When the user pulls down the latch fastener secondarily, the buckle will be separated from the buckle portion of the hook body, and the spring hook will rebound automatically. —S103

When the user releases the latch fastener and resets it to the first position by the elastic element, the second buckle means of the latch fastener and the first buckle means of the main body can be relatively buckled on the DIN rail to exhibit the state of tight coupling. —S104

*FIG. 6*

DIN RAIL INSTALLATION KIT AND ITS OPERATION METHOD

BACKGROUND OF THE INVENTION

1. Field of the Invention

The present invention relates to DIN rail installation kits and more particularly, to a DIN rail installation kit to be used to detachably install an electronic device on a DIN rail by secondarily pulling down a latch fastener and a spring hook.

2. Description of the Related Art

As computers or workstations adopt open-architecture operating systems and standardization of software and hardware, coupled with continuous expansion and upgrades of functions, manufacturers have developed industrial computers suitable for various professional fields. These industrial computers are mainly used in industrial control, industrial automation, network and communication equipment, machine vision, intelligent transportation systems, etc., and can also be applied to military with important tasks, transportation and aerospace fields that require high reliability and stability to meet customer-specific specifications and requirements for performing various high-performance operations in harsh environments.

In general, common industrial automation and control equipment are equipped with several embedded rails in the chassis or electric control cabinet, which is a standard metal stamping DIN rail developed by DIN (German Association for Standardization), and various industrial electronic devices, including embedded computers, expandable computers, industrial computer systems, IoT gateways, data acquisition modules, equipment condition monitoring and maintenance platforms, etc., or power supplies, programmable controllers (PLCs), electronic devices such as breakers are detachably hung and fixed on a rail by the assistance of a hanger. Through the elastic restoring force of an elastic element, the hanger can be firmly clamped on the DIN rail, which is convenient for the operator to install the electronic device.

As shown in FIG. 13, it is a schematic diagram of a conventional fixing clasp. The hanger A is generally a metal piece made of aluminum extrusion, and the top edge of the hanger A is bent downwards to form a barb-shaped hanging portion A1, a accommodating groove A11 in the hanging portion A1 is equipped with a reed B, and the bottom end of the hanger A is terminating in an inclined engaging portion A2.

When the hanger A is installed on the back of an electronic device C by screw locking, the hanger A can be hung on an upper rail D1 of a DIN rail D with the barb-shaped hanging portion A1, that is, use the reed B to buckle the upper rail D1 first, and apply a large amount of down force from the top of the electronic device C, and then forcefully push forward to make the inclined engaging portion A2 of the hanger A buckle a lower rail D2, and the hanger A can be tightly buckled to the DIN rail D through the mostly bending design of the reed B.

However, in practical applications, if the reed B bears the weight of the electronic device C itself and the inclined engaging portion A2 of the hanger A is buckled to the lower rail D2 of the DIN rail D in a shallow depth, when the electronic device C is operated for a long time and the vibrating environment is in the up and down direction of the Z axis and the direction in which it is removed, it will easily cause the inclined engaging portion A2 of the hanger A to slip off, and it may also be possible that when it is shaken, it will slide left and right and collide because it cannot be fixed. In addition, the fixing clasp lacks an effective disassembly and positioning design, that is, on-site workers cannot easily detach the fixing clasp from the DIN rail D, and in the process of removing the electronic device C, space is needed for pressing down. If the space available for installation inside the chassis or electric control cabinet is quite small, compact or densely wired, it will cause a certain degree of difficulty in installation. Especially when there are multiple electronic devices C to be installed, or when a large electronic device C is to be installed and two or more fixing clasps are required, if the fixing clasps do not have the function of manual locking and unlocking, it is impossible to unlock more than two fixing clasps at the same time because everyone has only two hands. That is, when disassembling, you need to use one hand to apply force to press down the electronic device C to overcome the clamping force of the reed B, and then use the other hand to remove the fixing clasp. More importantly, when the operation mode and installation space are restricted, the field workers will not be able to quickly and easily install or disassemble. Therefore, how to ensure that the DIN rail installation kit can be operated in a limited space, and to facilitate the stable installation or quick disassembly of the electronic device from the DIN rail, will also be an important key to the stability of the overall system. It needs to be redesigned by those engaged in this industry to effectively solve it.

SUMMARY OF THE INVENTION

The present invention has been accomplished under the circumstances in view. It is therefore one object of the present invention to provide a DIN rail installation kit to be used to install a preset electronic device on a DIN rail having a first flange and an opposing second flange or remove the electronic device from the DIN rail. The DIN rail installation kit comprises a main body combined with the electronic device, a spring hook affixed to the main body, a latch fastener, and an elastic element positioned between the main body and the latch fastener. When a user pulls down the latch fastener for the first time to move from the first position to the second position, a buckle of the latch fastener pushes down on a buckle portion of a hook body of the spring hook and deflects the hook body toward an adjacent side wall of the latch fastener, and then the buckle passes to below the buckle portion, the spring hook automatically rebounds so that a hook end of the hook body is temporarily positioned on the adjacent side wall of the latch fastener. When the user releases the latch fastener and uses the elastic element to drive the latch fastener upward, the buckle is then buckled on the buckle portion of the hook body, and a second buckle means of the latch fastener is kept away from a first buckle means of the main body to present the DIN rail installation kit in a removable state. When the user pulls down the latch fastener secondarily, the buckle is separated from the buckle portion of the hook body, and the spring hook rebounds automatically. When the user releases the latch fastener, the latch fastener is reset to the first position by the elastic element, and at the same time the second buckle means of the latch fastener and the first buckle means of the main body relatively buckled on the DIN rail to exhibit a state of tight coupling.

It is another object of the present invention to provide a DIN rail installation kit, wherein the DIN rail installation kit is installed on the DIN rail by first tilting the electronic device at an angle and making the main body close to the DIN rail, then the first buckle means is buckled on the first flange of the DIN rail, and then the electronic device is pushed forward to make it swing downward. At this time, since the latch fastener is in the unlocked state, the second flange of the DIN rail will not be blocked by the second buckle means, and the DIN rail can be directly embedded in a transverse slot of the first buckle means to form a tight joint. In this state, the user does not need to force the electronic device to press the DIN rail installation kit toward the DIN rail, and in an environment where the installation space is limited, it is still convenient for quick disassembly and more labor-saving. Even the electronic device can effectively support the overall structure under long-term operation and vibration environment. Because the second buckle means of the latch fastener blocks the exit direction of the DIN rail and the direction in which the first buckle means is acted on by the DIN rail is different, there is no possibility of separation in the direction of the DIN rail force (i.e. Z axis).

It is still another object of the present invention to provide a DIN rail installation kit, wherein when the user installs the electronic device on the DIN rail through the DIN rail installation kit, and when it is under a vibration environment, two pressing plates of an anti-slip structure of the main body and an upper hook of the first buckle means of the main body can be clamped on the two sides of the first flange of the DIN rail to prevent the electronic device from sliding left and right, or colliding with the adjacent electronic device, causing system damage or crash. An elastic body can also be used to increase its anti-slip and shock absorption effects, which can also ensure the stability of the overall operation.

It is still another object of the present invention to provide a DIN rail installation kit, wherein when the user wants to install the DIN rail installation kit on the DIN rail or perform disassembly, the screwdriver head at the front end of a screwdriver can be used to pass through a plug hole of a handle at the bottom side of the latch fastener and at this time, the user can use the lever force to push down to lock and release the latch fastener to realize the installation or disassembly of the DIN rail installation kit to the DIN rail. This hand tool operation method requires less space, and the force required for leveraging is small and more labor-saving.

Other advantages and features of the present invention will be fully understood by reference to the following specification in conjunction with the accompanying drawings, in which like reference signs denote like components of structure.

BRIEF DESCRIPTION OF THE DRAWINGS

FIG. 6 is an operation flow chart of the present invention.

DETAILED DESCRIPTION OF THE PREFERRED EMBODIMENT

Figure 1:
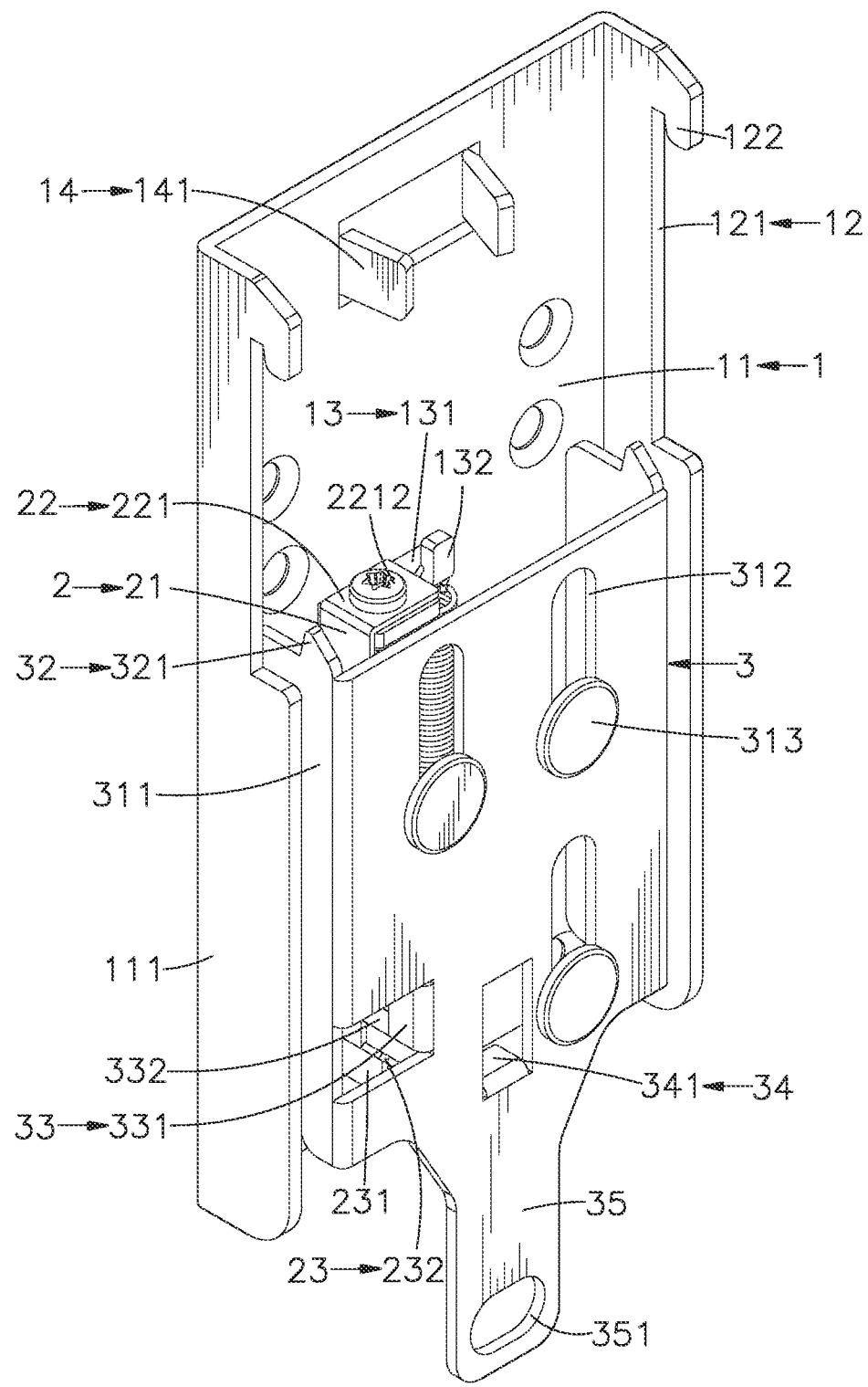
FIG. 1 is an oblique top elevational view of a DIN rail installation kit in accordance with the present invention.
Figure 2:
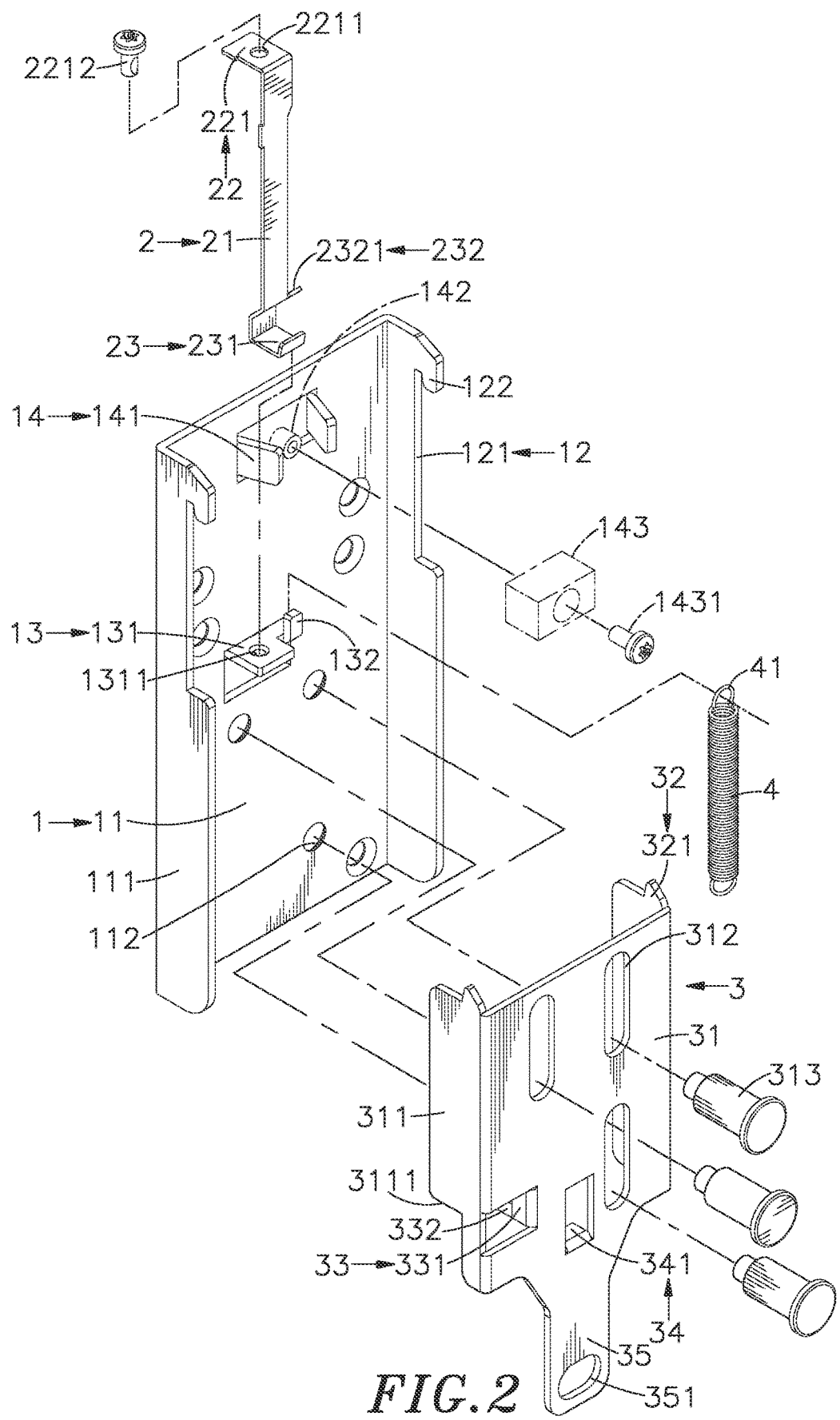
FIG. 2 is an exploded view of the DIN rail installation kit in accordance with the present invention.
Figure 3:
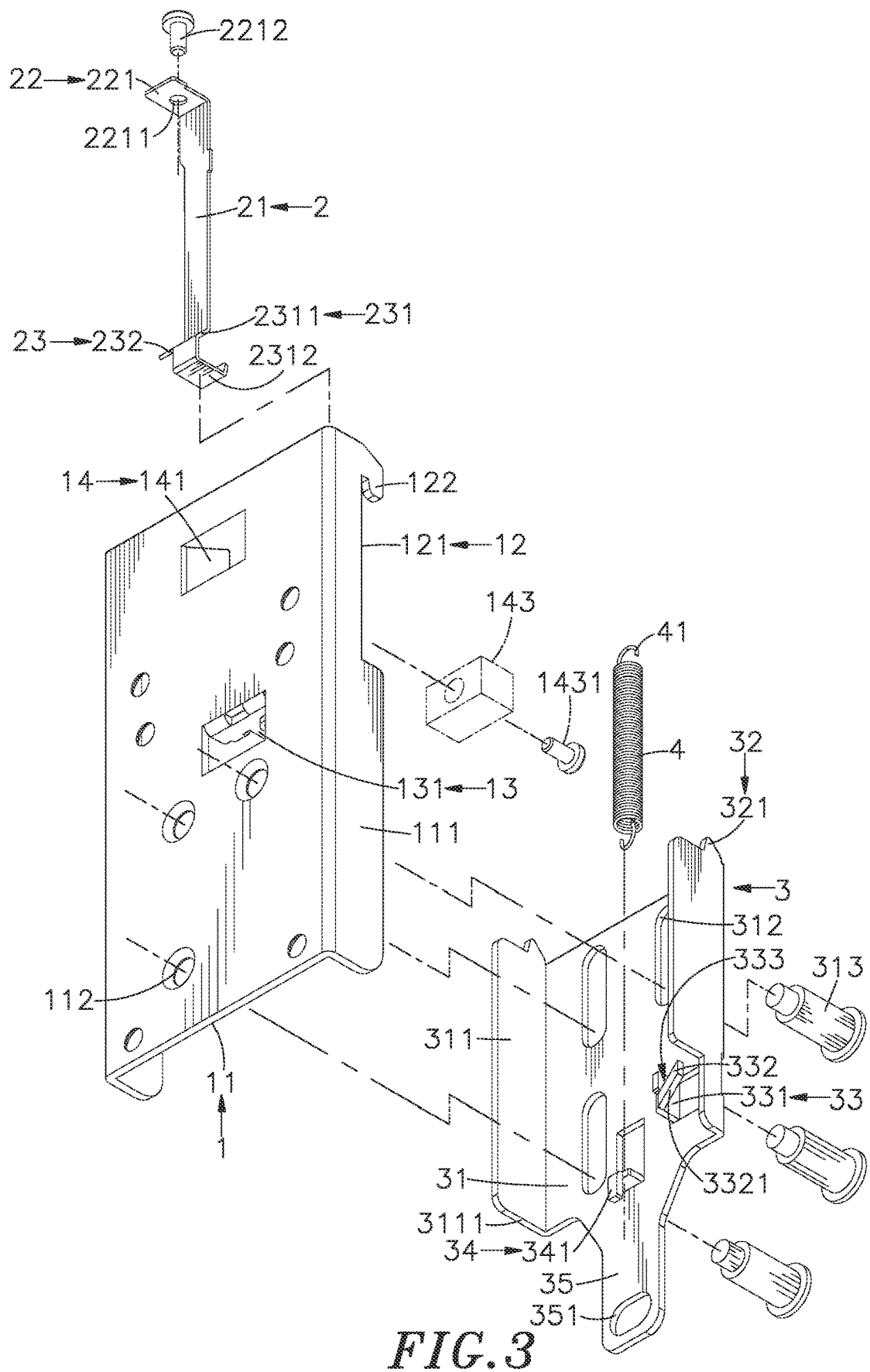
FIG. 3 corresponds to FIG. 2 when viewed from another angle.
Figure 4:
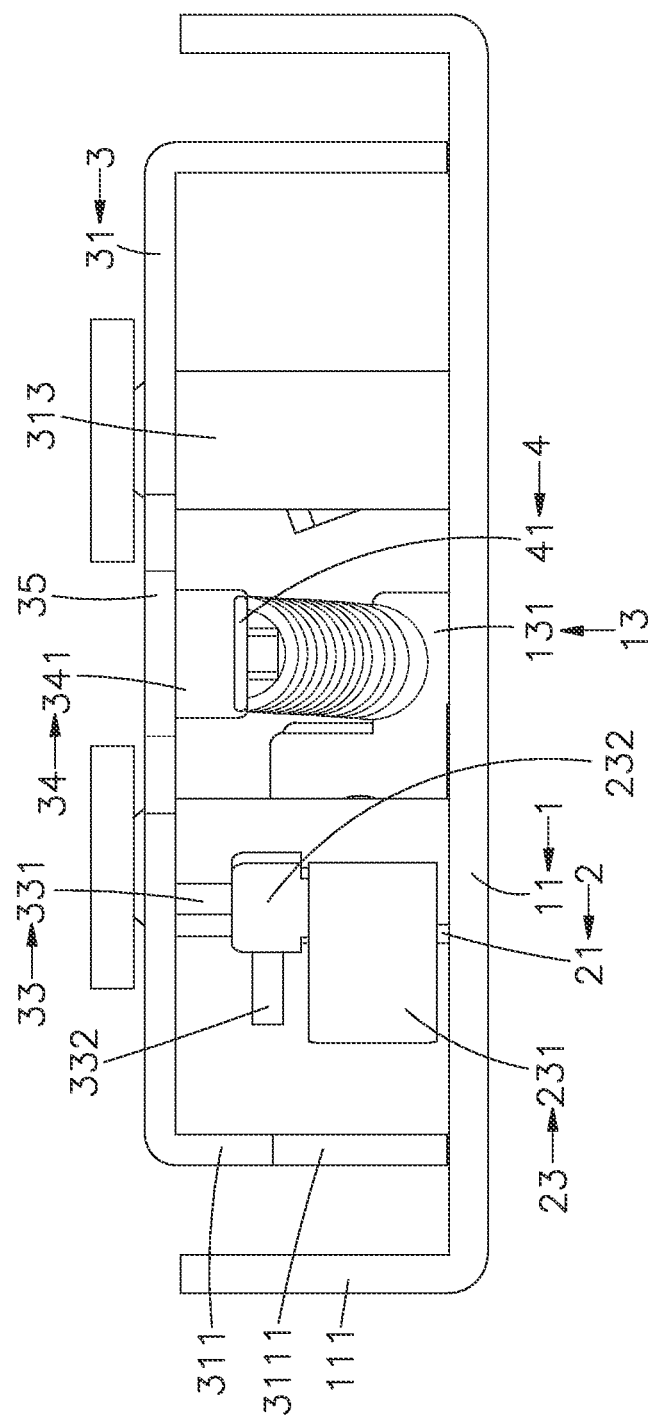
FIG. 4 is a top view of the DIN rail installation kit in accordance with the present invention.
Figure 5:
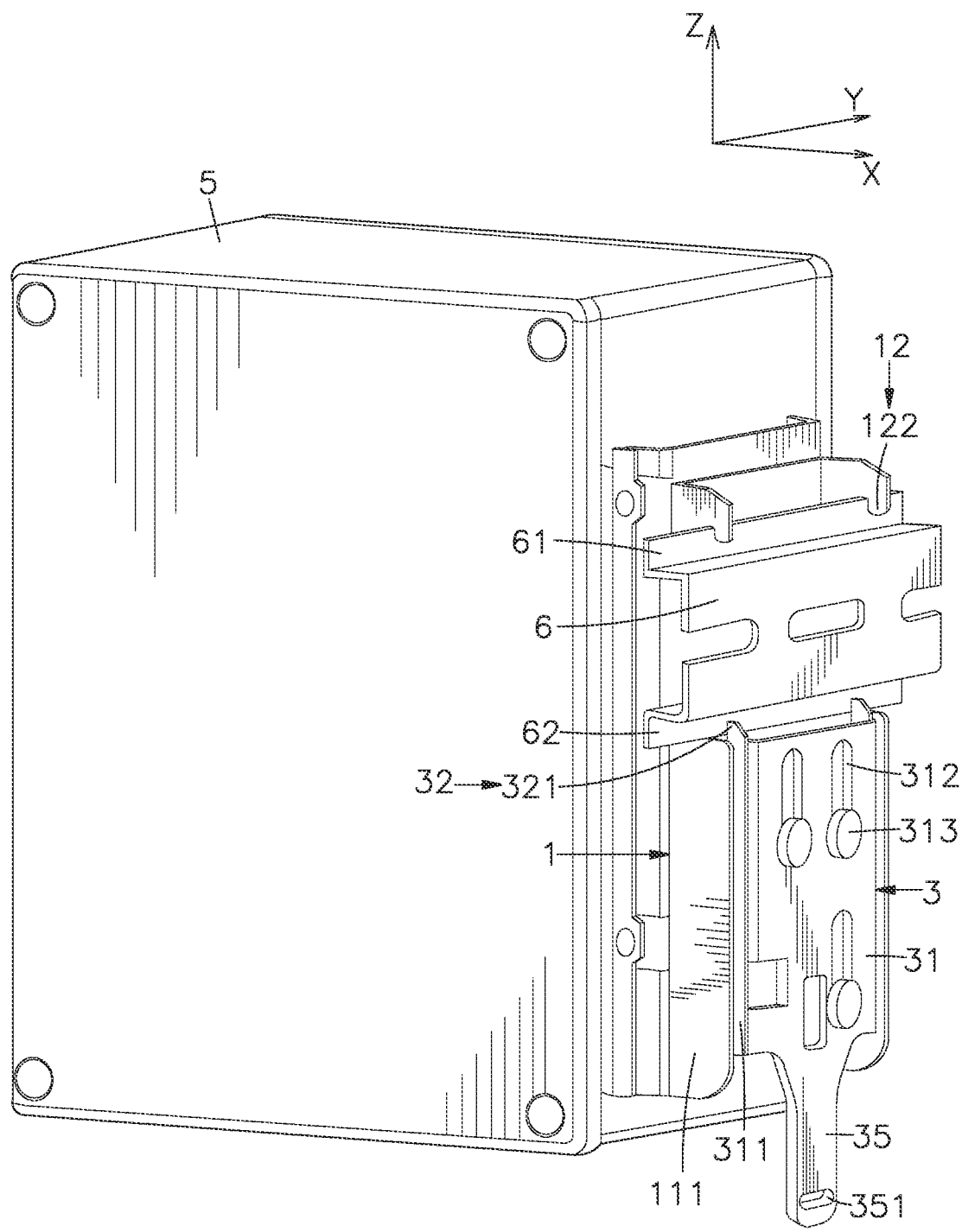
FIG. 5 is an applied view of the present invention.

Please refer to FIGS. 1-6, in which FIG. 1 is an oblique top elevational view of a DIN rail installation kit in accordance with the present invention; FIG. 2 is an exploded view of the DIN rail installation kit in accordance with the present invention; FIG. 3 corresponds to FIG. 2 when viewed from another angle; FIG. 4 is a top view of the DIN rail installation kit in accordance with the present invention; FIG. 5 is an applied view of the present invention; FIG. 6 is an operation flow chart of the present invention. As illustrated, the DIN rail installation kit comprises a main body 1, a spring hook 2, a latch fastener 3 and an elastic element 4.

The main body 1 comprises a vertical base frame 11, two first buckle means 12, a mounting structure 13, and an anti-slip structure 14. The vertical base frame 11 has two side panels 111 respectively located at two opposite lateral sides thereof, and a plurality of mounting holes 112 screwed, riveted or welded to the back of the housing of an electronic device 5. The two first buckle means 12 are respectively formed on the two side panels 111, each comprising a transverse slot 121 and an upper hook 122 downwardly curved from a top side of the transverse slot 121. The mounting structure 13 comprises a locating plate 131 inwardly extended from the surface of the base frame 11, a screw hole 1311 formed on the locating plate 131, and an upper hooking plate 132 upwardly extended from the locating plate 131. The anti-slip structure 14 is located on the base frame 11 above the mounting structure 13, comprising two pressing plates 141 inwardly extended from the base frame 11. In this embodiment, the anti-slip structure 14 is illustrated by two pressing plates 141 inwardly extended from the base frame 11. However, in practical applications, in an alternate form of the anti-slip structure 14, a stud 142 can also be provided on the surface of the base frame 11 (as shown in the dotted line in FIGS. 2 and 3), and an elastic body 143 made of rubber, silicone or polymer can be affixed to the stud 142 with a screw 1431 screwed into the stud 142.

The spring hook 2 is made of a resilient metal sheet by punching and bending, comprising an upright swing arm 21, a mounting part 22 located at a top end of the swing arm 21 and a hook body 23 located at an opposing bottom end of the swing arm 21. The mounting part 22 comprises a horizontal top lug 221 perpendicularly outwardly extended from the top end of the swing arm 21 and attached onto the locating plate 131 of the mounting structure 13, a through hole 2211 located on the top lug 221, and a screw 2212 mounted in the through hole 2211 and threaded into the screw hole 1311 of the locating plate 131 to affix the top lug 221 to the locating plate 131. However, this mounting design is not a limitation. The mounting part 22 of the spring hook 2 can also be affixed to the mounting structure 13 of the main body 1 by riveting or welding. The hook body 23 comprises a hook end 231 and a buckle portion 232. The hook end 231 comprises an oblique arm 2311 protruding from the bottom end of the swing arm 21, and a barbed tail 2312 extending downward from the distal end of the oblique arm 2311 for a distance and then curved backwards. The buckle portion 232 protrudes laterally from one side of the oblique arm 2311 and defines an inclined pushing surface 2321 on an outer surface thereof.

The latch fastener 3 comprises a sliding plate 31 coupled to and vertically movable back and forth on the base frame 11, two side walls 311 respectively located at two opposite lateral sides of the sliding plate 31, a notch 3111 located on a lower side of one side wall 311, and two second buckle means 32 respectively located on respective top edges of the side walls 311 corresponding to the first buckle means 12 of the main body 1. In this embodiment, each second buckle means 32 is formed of a protruding lower stopping block 321. However, the design of the protruding lower stopping block 321 is not a limitation. Alternatively, the top edge of the sliding plate 31 can be bent to form an upwardly convex blocking portion. Furthermore, the sliding coupling structure between the sliding plate 31 of the latch fastener 3 and the base frame 11 of the main body 1 comprises a plurality of longitudinal sliding slots 312 formed on the sliding plate 31, and a plurality of guide posts 313 respectively inserted through the longitudinal sliding slots 312 and fastened to the respective mounting holes 112. In the present preferred embodiment, the guide posts 313 are stop screws respectively inserted through the longitudinal sliding slots 312 and threaded into the respective mounting holes 112 of the base frame 11 to guide sliding movement of the sliding plate 31 of the latch fastener 3 relative to the base frame 11 of the main body 1. In addition, the latch fastener 3 further comprises a buckle 33 on the surface of the sliding plate 31 near one side wall 311, a positioning means 34 made in the form of a gusset 341 and provided on the surface under the center of the sliding plate 31 near the buckle 33, and a handle 35 with a plug hole 351 located below the positioning means 34 and extending downward at a distance. The buckle 33 comprises a vertical section 331 inwardly extended from the sliding plate 31, an inclined section 332 obliquely upwardly extended from the vertical section 331 toward the adjacent side wall 311 and provided with a push surface 3321 at a bottom side thereof, and a stop point 333 defined in the V-shaped included angle formed between the vertical section 331 and the inclined section 332.

The preferred implementation of the elastic element 4 is a tension spring, and the upper and lower ends of the tension spring are respectively provided with hook rings 41. But in actual application, the elastic element 4 can also adopt various types of compression spring, reed or torsion spring, etc. If the tension spring is used as an illustration, the elastic element 4 can be housed between the main body 1 and the latch fastener 3, and the two hook rings 41 are respectively fastened to the upper hooking plate 132 of the mounting structure 13 and the gusset 341 of the positioning means 34. In this way, the elastic element 4 can be used to drive the latch fastener 3 to return to the initial position.

In this embodiment, the above-mentioned DIN rail installation kit is installed on the back of the housing of the electronic device 5, and the electronic device 5 is hung on a DIN rail 6 in a chassis or electric control cabinet using the DIN rail installation kit. The preferred implementation of the electronic device 5 can be an embedded fanless computer, but it is not limited to this. It can also be an industrial computer system, an IoT gateway, a data acquisition module or various other industrial electronic devices. The upper and lower ends of the DIN rail 6 are respectively provided with a first flange 61 and a second flange 62.

As shown in FIG. 6, the present invention additionally provides a DIN rail installation kit operation method. This DIN rail installation kit is suitable for installing the electronic device 5 on the DIN rail 6 or quick disassembly from the DIN rail 6, and comprises the main body 1, the spring hook 2, the latch fastener 3 and the elastic element 4 combined with the electronic device 5. The on-site operator or user can pull down the latch fastener 3 twice to move between a first position and a second position to assist the installation and disassembly of the electronic device 5 and the DIN rail 6. The operation method comprises the steps of:

(S101) When the user pulls down the latch fastener 3 for the first time to move from the first position to the second position, the buckle 33 will push down on the buckle portion 232 of the hook body 23 under the spring hook 2 and deflect the hook body 23 toward the adjacent side wall 311 of the latch fastener 3, and when the buckle 33 passes the buckle portion 232, the spring hook 2 will automatically rebound so that the hook end 231 of the hook body 23 is temporarily positioned on the adjacent side wall 311.

(S102) When the user releases the latch fastener 3 and uses the elastic element 4 to drive it upward, the buckle 33 will be buckled on the buckle portion 232 of the hook body 23, and the second buckle means 32 of the latch fastener 3 will be kept away from the first buckle means 12 of the main body 1, and the DIN rail installation kit will be detachable.

(S103) When the user pulls down the latch fastener 3 secondarily, the buckle 33 will be separated from the buckle portion 232 of the hook body 23, and the spring hook 2 will rebound automatically.

(S104) When the user releases the latch fastener 3 and resets it to the first position by the elastic element 4, the second buckle means 32 of the latch fastener 3 and the first buckle means 12 of the main body 1 can be relatively buckled on the DIN rail 6 to exhibit the state of tight coupling.

Figure 7:
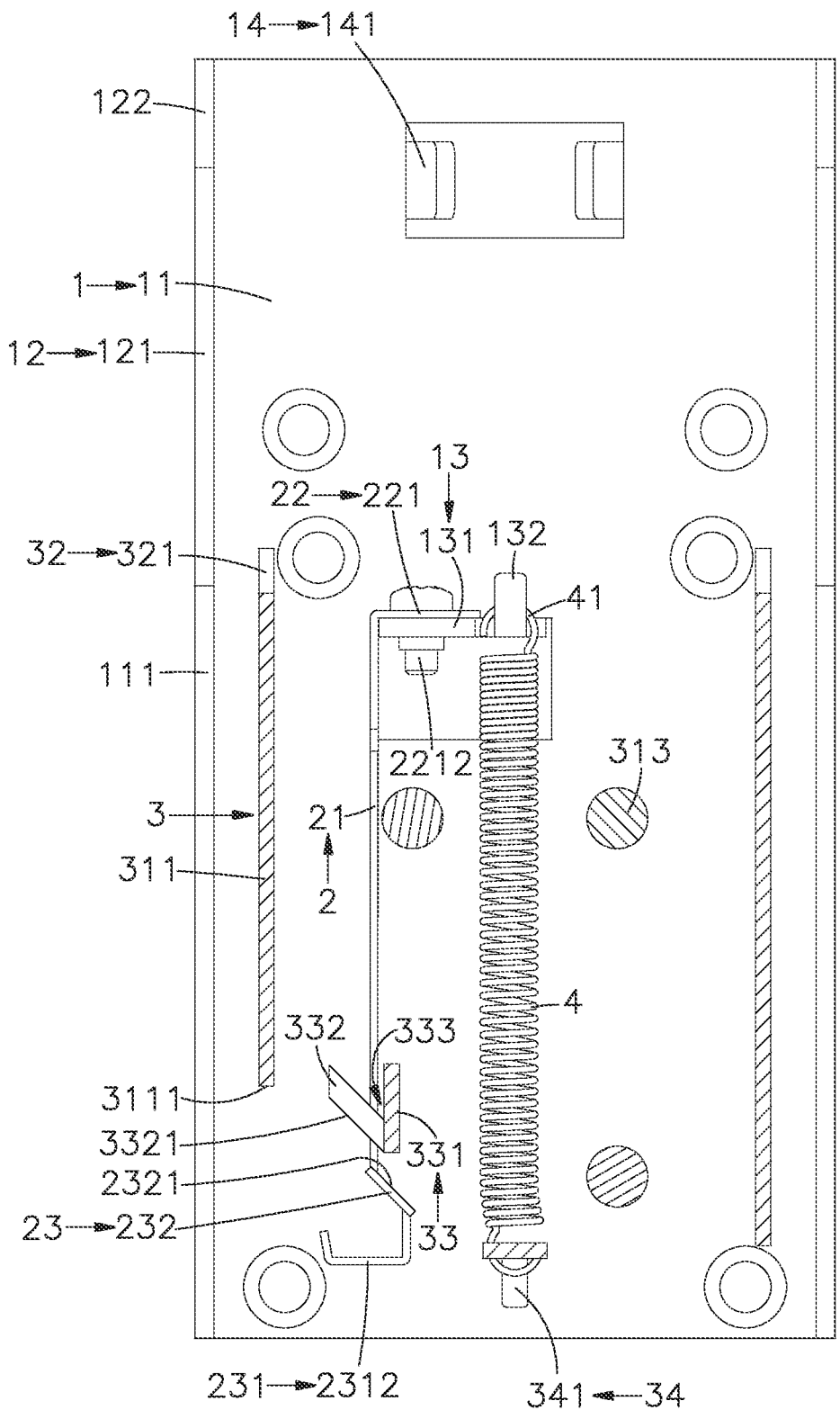
FIG. 7 is a sectional front view of the DIN rail installation kit in accordance with the present invention.
Figure 8A:
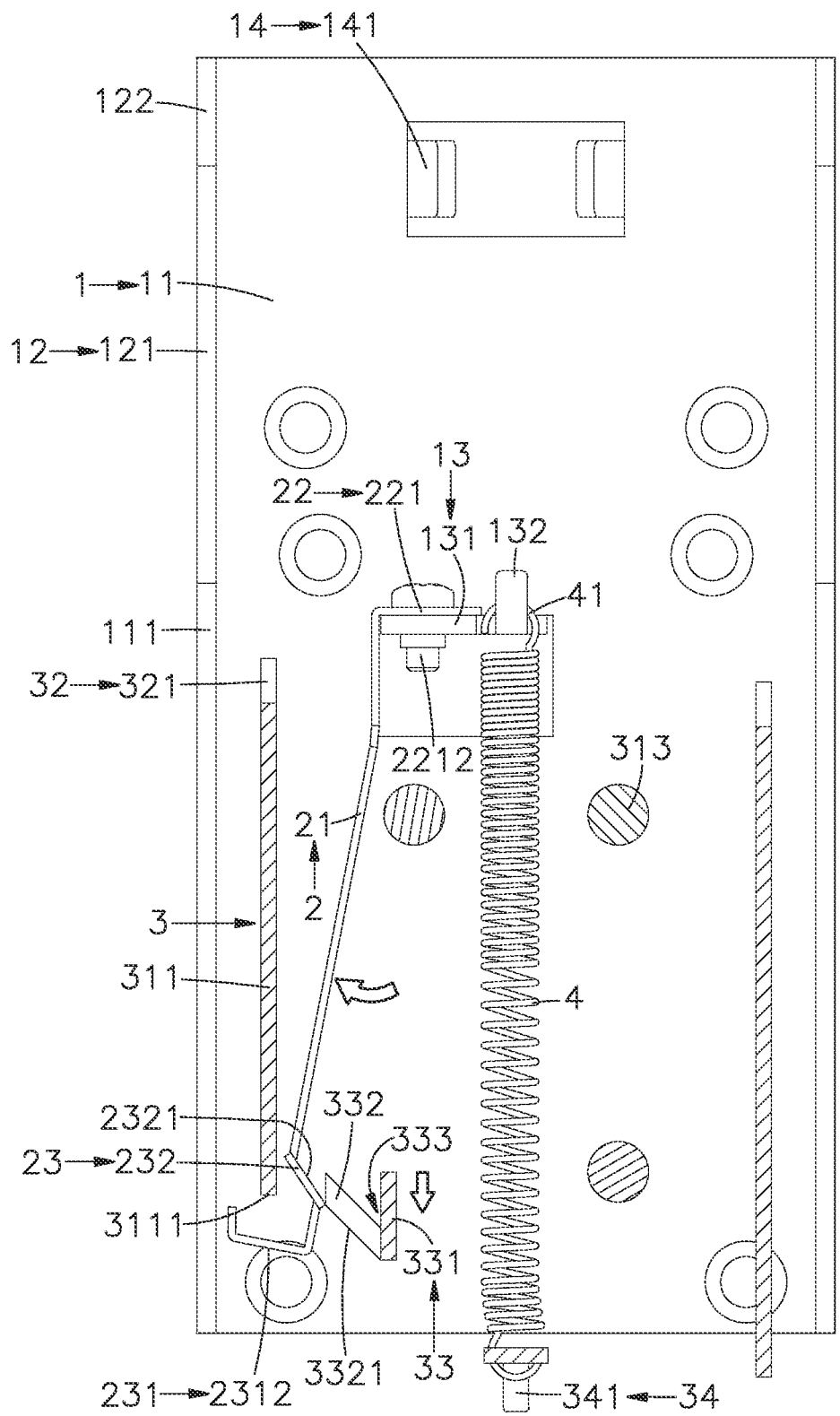
FIG. 8A is a front sectional view of the DIN rail installation kit of the present invention when it is first pulled down (I).
Figure 8B:
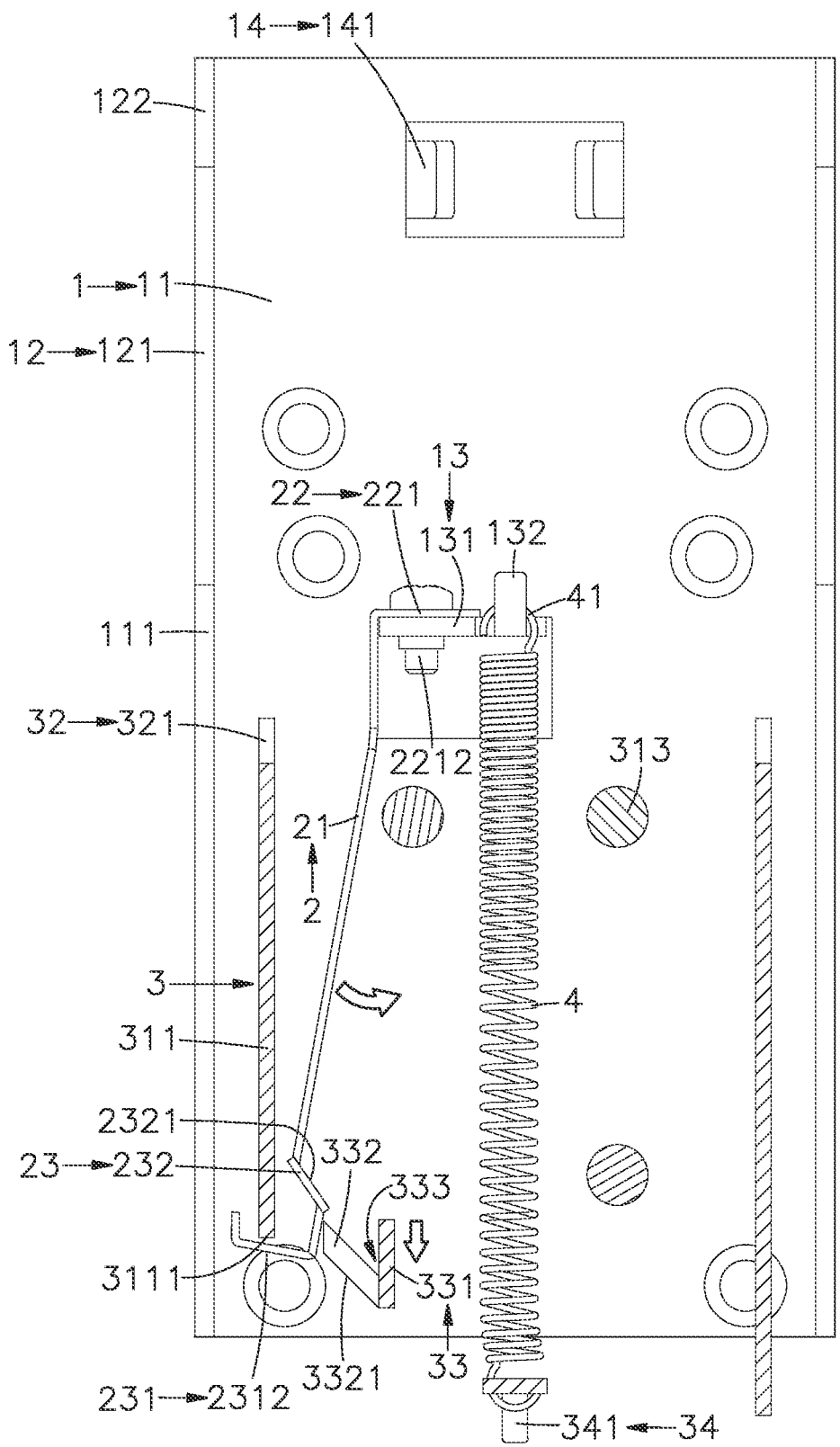
FIG. 8B is a front sectional view of the DIN rail installation kit of the present invention when it is first pulled down (II).
Figure 9:
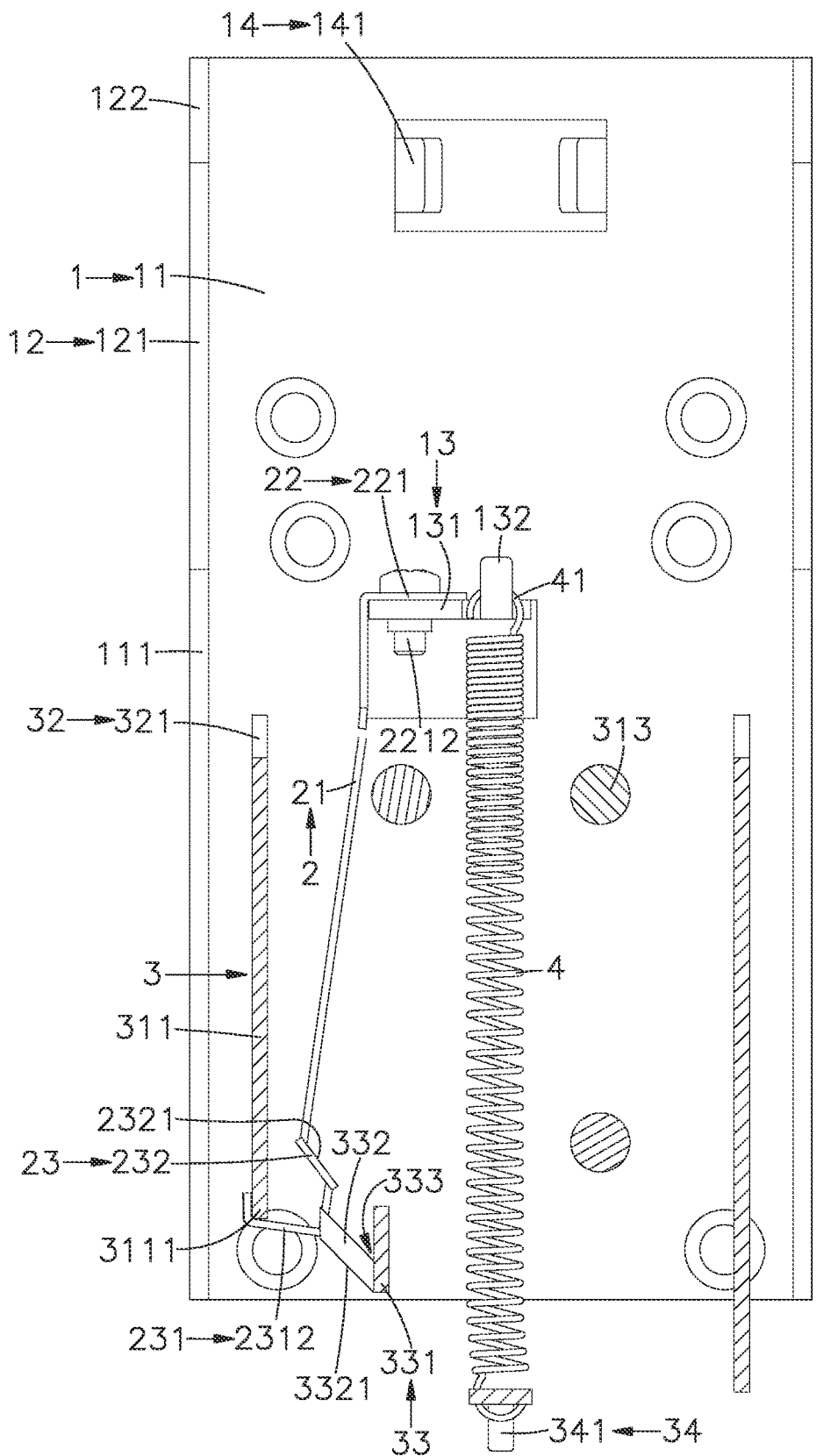
FIG. 9 is a front sectional view of the DIN rail installation kit of the present invention when it is pulled down to the bottom.
Figure 10A:
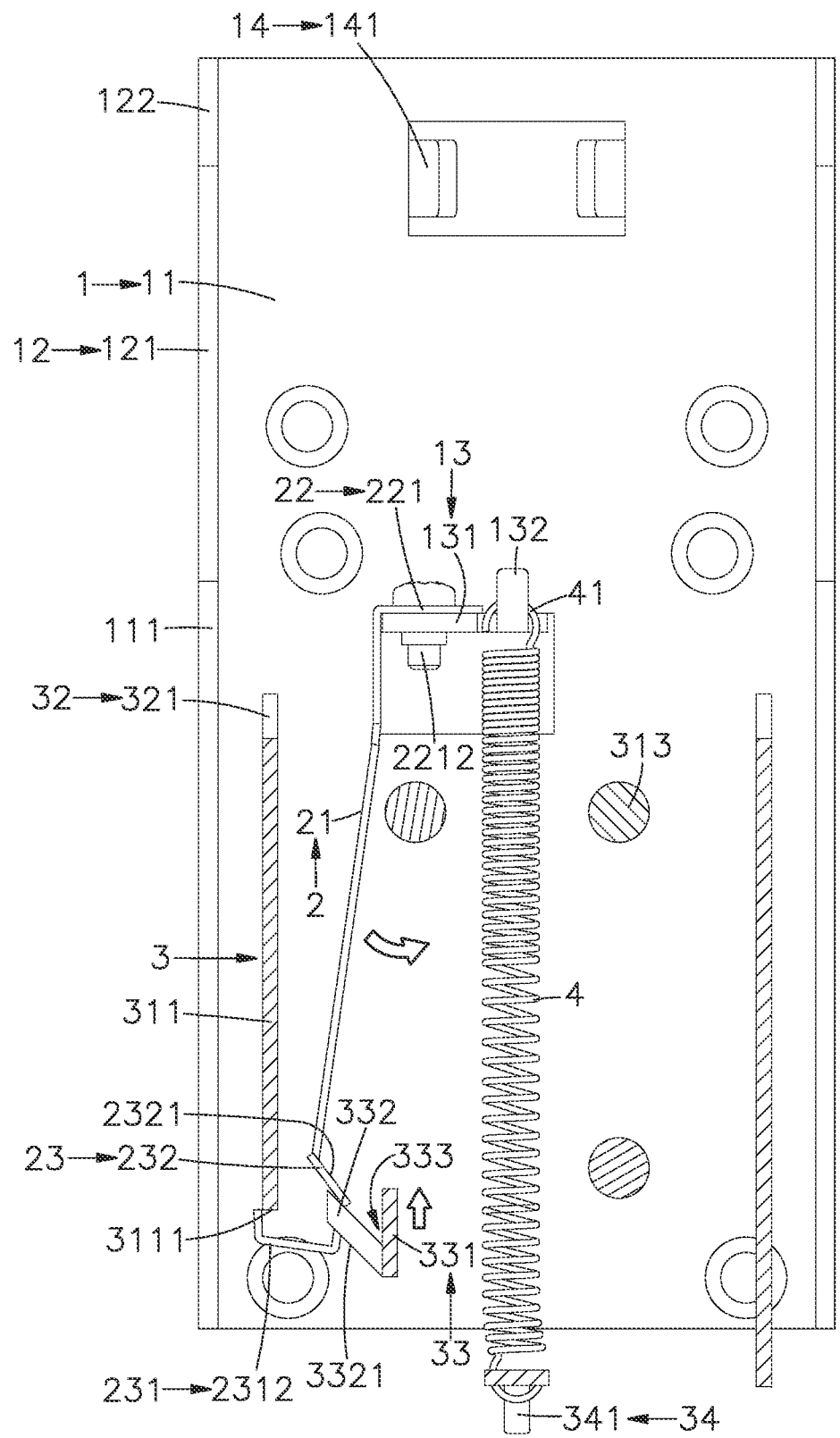
FIG. 10A is a front sectional view of the DIN rail installation kit of the present invention when it is released for the first time (I).
Figure 10B:
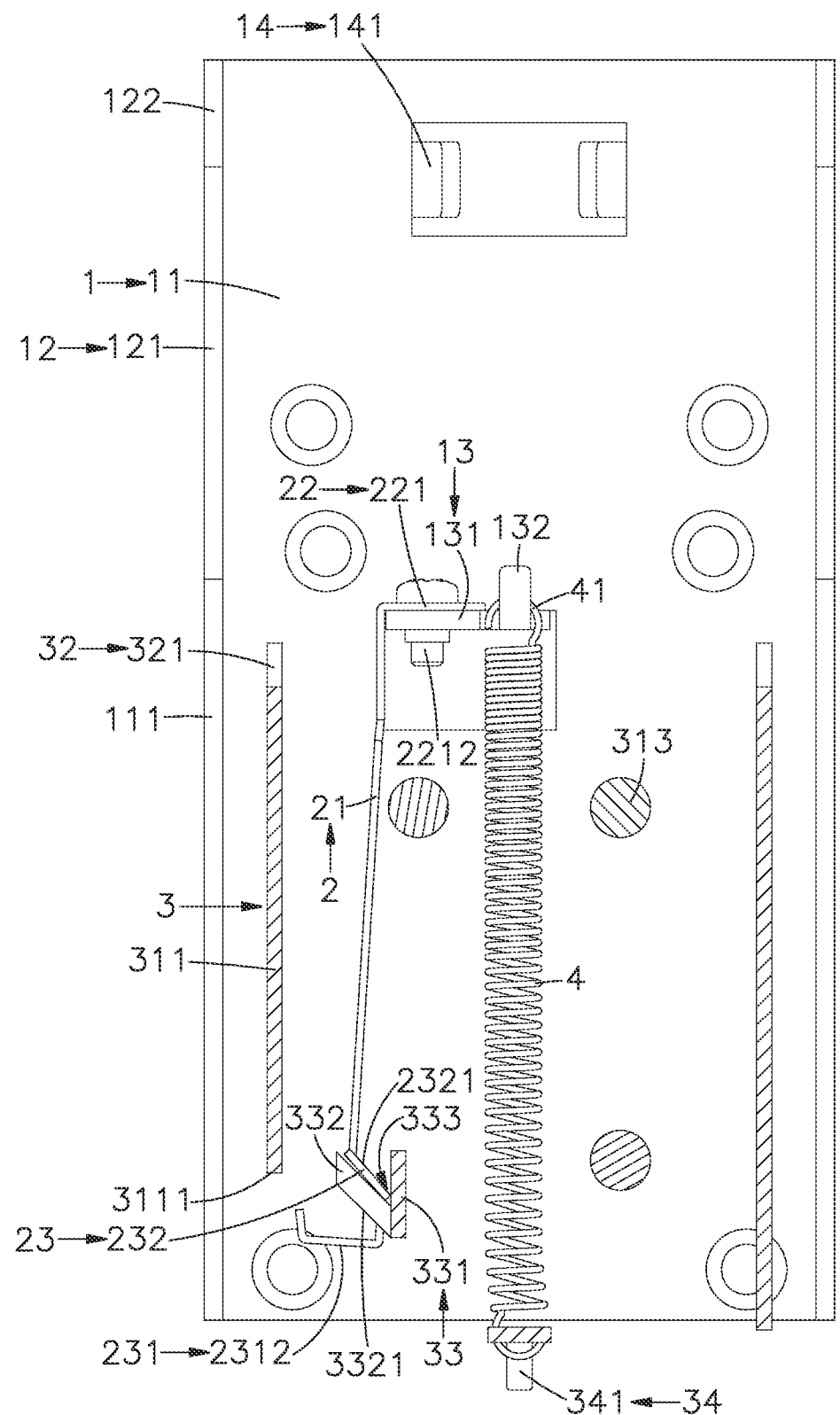
FIG. 10B is a front sectional view of the DIN rail installation kit of the present invention when it is released for the first time (II).

Please refer to FIGS. 7, 8A, 8B, 9, 10A and 10B, in which FIG. 7 is a sectional front view of the DIN rail installation kit in accordance with the present invention; FIG. 8A is a front sectional view of the DIN rail installation kit of the present invention when it is first pulled down (I); FIG. 8B is a front sectional view of the DIN rail installation kit of the present invention when it is first pulled down (II); FIG. 9 is a front sectional view of the DIN rail installation kit of the present invention when it is pulled down to the bottom; FIG. 10A is a front sectional view of the DIN rail installation kit of the present invention when it is released for the first time (I); FIG. 10B is a front sectional view of the DIN rail installation kit of the present invention when it is released for the first time (II). It can be clearly seen from the drawings that the latch fastener 3 of the present invention can be moved between the first position where the DIN rail installation kit is in the locked state and the second position where the DIN rail installation kit is in the unlocked state. When the user pulls down the handle 35 of the latch fastener 3 from the first position to the second position for the first time, the inclined section 332 of the buckle 33 will push the inclined pushing surface 2321 of the buckle portion 232 of the hook body 23 of the spring hook 2 downwards, causing the hook body 23 to drive the swing arm 21 to swing toward the adjacent side wall 311 of the sliding plate 31 with the mounting part 22 as the center, so that the barbed tail 2312 of the hook end 231 can pass through the notch 3111 of the side wall 311, and the side wall 311 of the sliding plate 31 is approached toward the hook end 231. After the latch fastener 3 is pulled down to the lowest point, the buckle 33 can pass to the bottom of the buckle portion 232. At this time, the second buckle means 32 will also be completely separated from the second flange 62 of the DIN rail 6, and the spring hook 2 will be in a released state, which can automatically rebound through its own elastic restoring force. But during the rebound of the hook body 23, the barbed tail 2312 of the hook end 231 will be blocked by the side wall 311 of the sliding plate 31 and temporarily positioned on the adjacent side wall 311, making the inclined section 332 of the buckle 33 and the buckle portion 232 of the hook body 23 form an up-and-down correspondence. Then the user releases the handle 35, and the elastic restoring force of the elastic element 4 drives the latch fastener 3 to move upward, and the notch 3111 on the side wall 311 of the sliding plate 31 is gradually separated from the hook end 231 of the hook body 23. At this time, since the buckle portion 232 of the hook body 23 has an inclination angle relative to the inclined section 332 of the buckle 33 and forms an up-and-down corresponding state, when the swing arm 21 of the spring hook 2 automatically rebounds, the buckle portion 232 of the hook body 23 can move along the inclined section 332 of the buckle 33 and enter the stop point 333. After the sliding plate 31 drives the buckle 33 to move up to a distance, the stop point 333 of the buckle 33 can be buckled up to the buckle portion 232 of the hook body 23 to form a blocking position, and the second buckle means 32 of the latch fastener 3 is kept away from the transverse slot 121 of the first buckle means 12 of the main body 1. At the same time, the second buckle means 32 has also been separated from the second flange 62 of the DIN rail 6, so that the DIN rail installation kit is in an unlocked and detachable state, that is, the electronic device 5 can be quickly disassembled or replaced.

In this embodiment, the DIN rail installation kit is installed on the DIN rail 6 by first tilting the electronic device 5 at an angle and making the main body 1 close to the DIN rail 6, then the upper hooks 122 of the first buckle means 12 are respectively buckled on the first flange 61 of the DIN rail 6, and then the electronic device 5 is pushed forward to make it swing downward. At this time, since the latch fastener 3 is in the unlocked state, the second flange 62 of the DIN rail 6 will not be blocked by the second buckle means 32, and the DIN rail 6 can be directly embedded in the transverse slot 121 of the first buckle means 12 to form a tightly joined state. In this state, the user does not need to force the electronic device 5 to press the DIN rail installation kit toward the DIN rail 6, and in an environment where the installation space is limited, it is still convenient for quick disassembly and more labor-saving.

Figure 11:
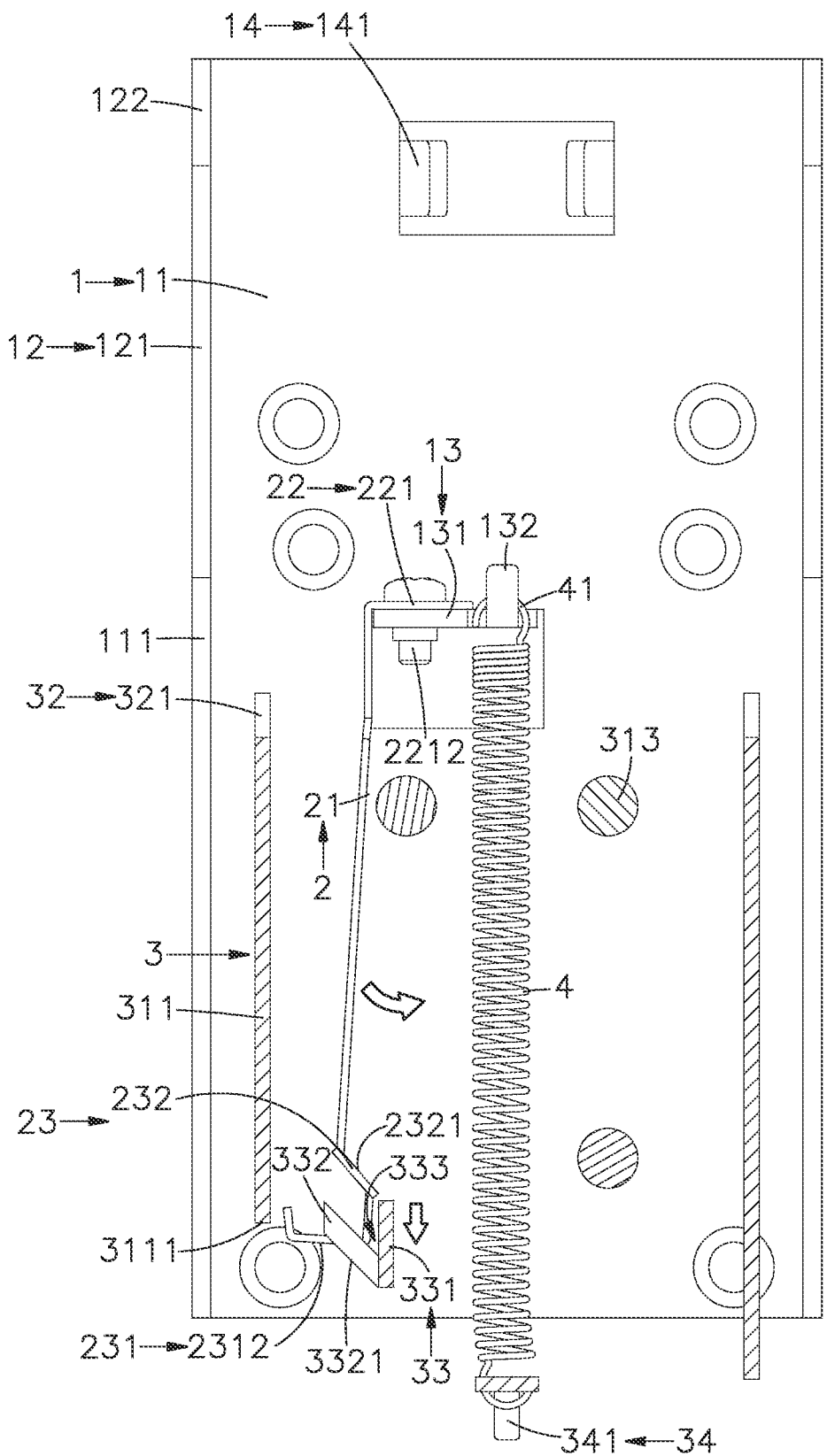
FIG. 11 is a front sectional view of the DIN rail installation kit of the present invention when it is pulled down for the second time.
Figure 12:
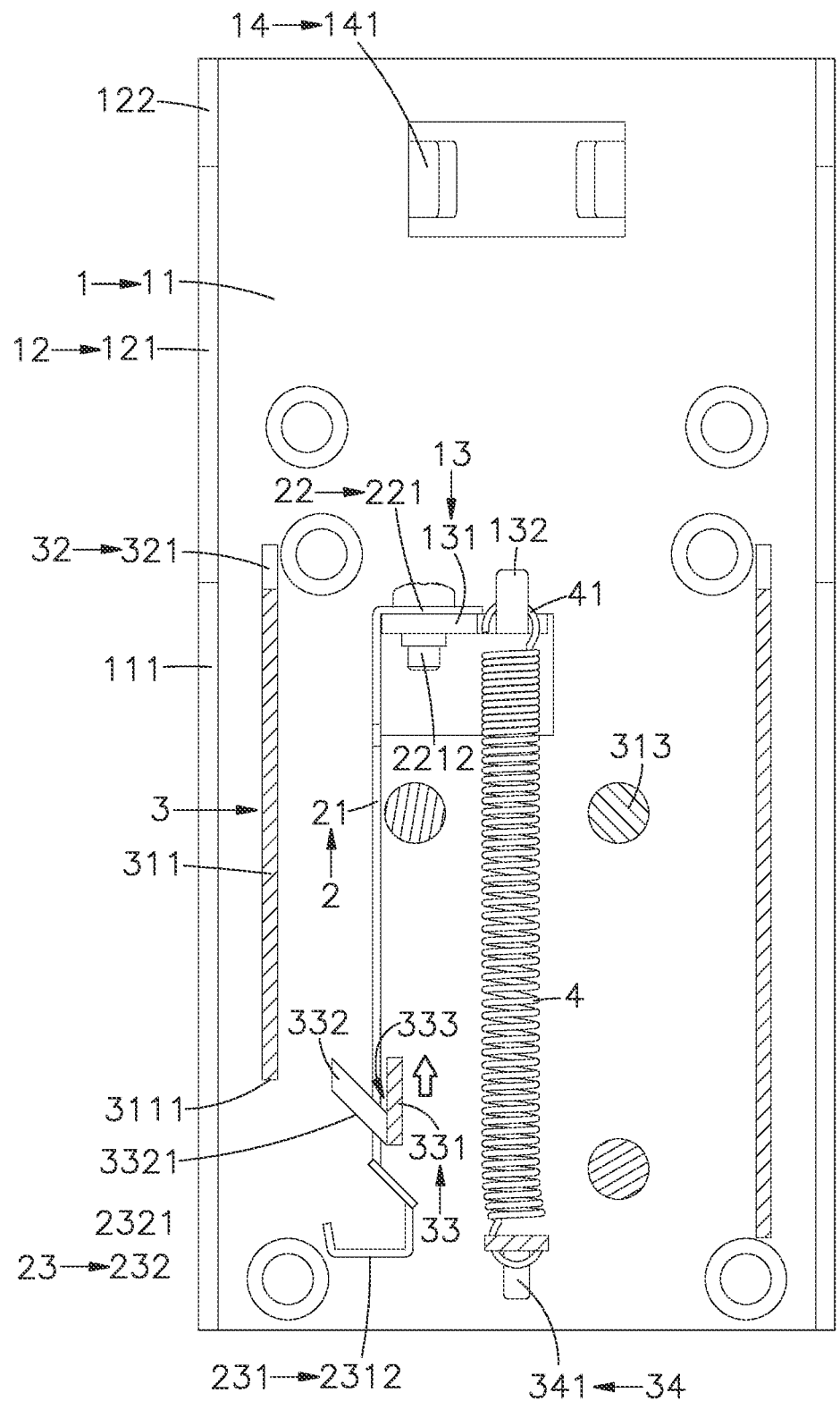
FIG. 12 is a front sectional view of the DIN rail installation kit of the present invention when it is released for the second time.
Figure 13:
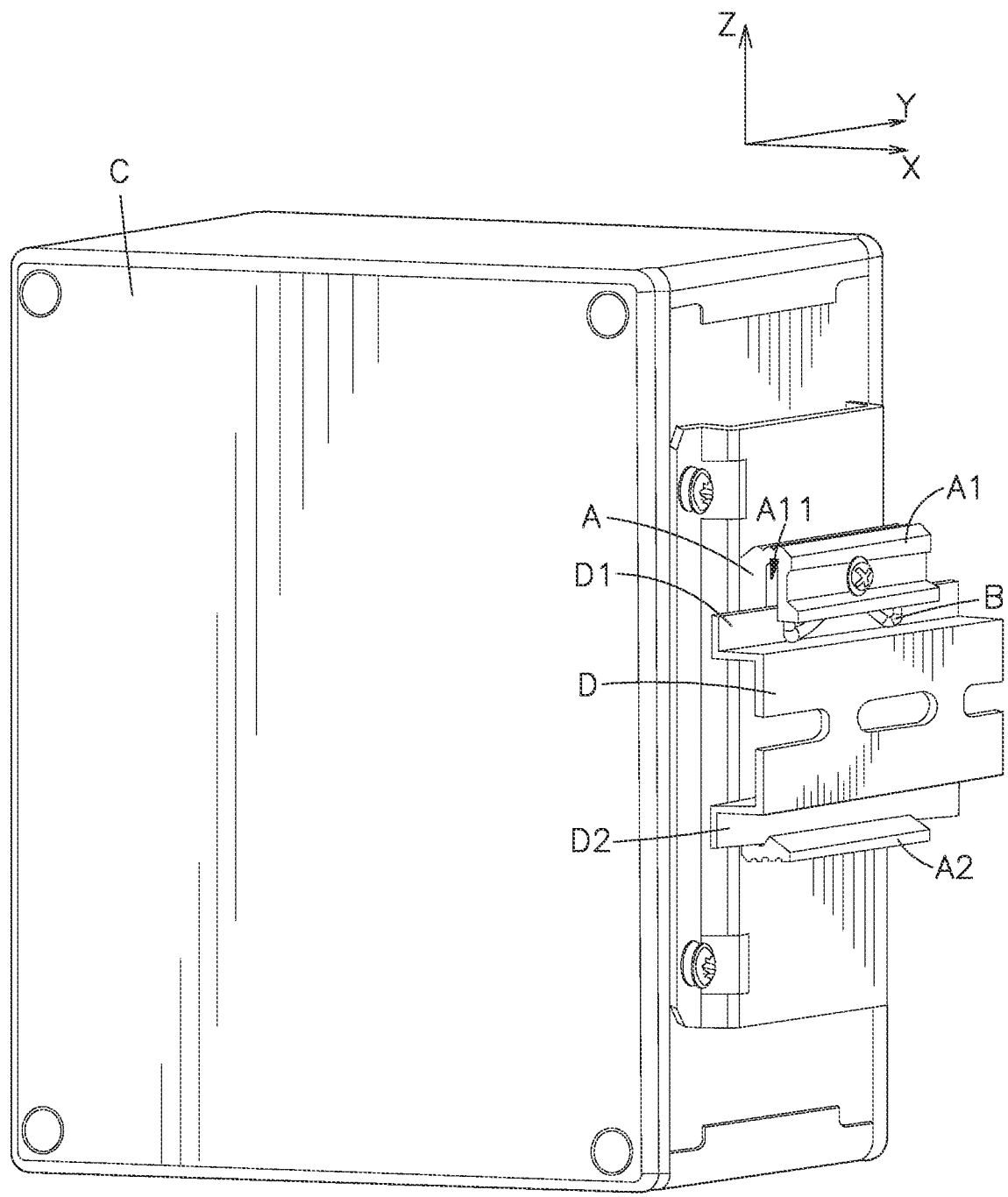
FIG. 13 is a schematic applied view of a fixing clasp according to the prior art.

Please refer to FIGS. 11 and 12, in which FIG. 11 is a front sectional view of the DIN rail installation kit of the present invention when it is pulled down for the second time; FIG. 12 is a front sectional view of the DIN rail installation kit of the present invention when it is released for the second time. When the user pulls down the latch fastener 3 secondarily to lock the DIN rail installation kit and the DIN rail 6, the user can manually pull down the handle 35 of the latch fastener 3, or insert the screwdriver head at the front of the screwdriver into the plug hole 351 of the handle 35 and then use leverage to push down. After releasing the latch fastener 3, the elastic element 4 can drive the latch fastener 3 to move from the second position to the original first position. While the latch fastener 3 is moving, the stop point 333 of the buckle 33 will detach from the buckle portion 232 of the hook body 23 downward, and the spring hook 2 will automatically rebound to the initial position. Then release the latch fastener 3, and the elastic element 4 can drive the latch fastener 3 to move up to the original first position, and the top of the sliding plate 31 is elastically supported on the second flange 62 of the DIN rail 6, and the lower stopping block 321 of the second buckle means 32 is blocked on the outer surface of the second flange 62, so that the second buckle means 32 of the latch fastener 3 can be matched with the first buckle means 12 of the main body 1 to be relatively buckled on the DIN rail 6 in a tightly joined state. Even the electronic device 5 can effectively support the overall structure under long-term operation and vibration environment. Because the second buckle means 32 of the latch fastener 3 blocks the exit direction of the DIN rail 6 and the direction in which the first buckle means 12 is acted on by the DIN rail 6 is different, there is no possibility of separation in the direction of the DIN rail 6 force (i.e. Z axis).

Please refer to FIGS. 2 and 5, when the user installs the electronic device 5 on the DIN rail 6 through the DIN rail installation kit, and when it is under a vibration environment, the two pressing plates 141 of the anti-slip structure 14 and the upper hook 122 of the first buckle means 12 can be clamped on the two sides of the first flange 61 of the DIN rail 6 to prevent the electronic device 5 from sliding left and right, or colliding with the adjacent electronic device 5, causing system damage or crash. The elastic body 143 can also be used to increase its anti-slip and shock absorption effects, which can also ensure the stability of the overall operation.

In this embodiment, when the user desires to install the DIN rail installation kit on the DIN rail 6 or perform disassembly, the screwdriver head at the front end of the screwdriver can be used to pass through the plug hole 351 of the handle 35 and hold it against the internal mechanism of the chassis or electric control cabinet. At this time, the user can use the lever force to push down to lock and release the latch fastener 3 to realize the installation or disassembly of the DIN rail installation kit to the DIN rail 6. This hand tool operation method requires less space as a whole, and the force required for leveraging is smaller and more labor-saving.

In addition, if the electronic device 5 is an industrial computer system with modular design (such as multiple single-board computers installed in the shell of the blade server), it is large and heavy, and there are multiple DIN rail installations on the back of the shell, the user only needs to pull down the latch fastener 3 and the spring hook 2 twice to lock and release, and the electronic device 5 together with the DIN rail installation kit can be quickly disassembled or replaced from the DIN rail 6, and the time for manual work is greatly shortened, and it has the effect of fast assembly and easy maintenance.

Although particular embodiments of the invention have been described in detail for purposes of illustration, various modifications and enhancements may be made without departing from the spirit and scope of the invention. Accordingly, the invention is not to be limited except as by the appended claims.

What the invention claimed is:

1. A DIN rail installation kit used to install a preset electronic device on a DIN rail having a first flange and an opposing second flange or remove said electronic device from said DIN rail, the DIN rail installation kit comprising:
    a main body comprising a base frame combined with said electronic device and a first buckle means for snapping onto said first flange of said DIN rail;
    a spring hook comprising a swing arm affixed to said base frame of said main body and a hook body located at a bottom end of said swing arm, said hook body comprising a hook end and a buckle portion protruding laterally from said hook end;
    a latch fastener comprising a sliding plate coupled to and vertically movable back and forth on said base frame of said main body, a second buckle means for buckling on said second flange of said DIN rail and a buckle located on said sliding plate, said latch fastener being movable between a first position and a second position, so that when said latch fastener is displaced from said first position to said second position, said buckle is buckled on said buckle portion of said hook body, and said second buckle means is far away from said first buckle means for allowing removal of said DIN rail installation kit from said DIN rail; when said latch fastener is moved from said second position back to said first position, said buckle portion of said hook body is separated from said buckle and said second buckle means and said first buckle means are relatively buckled on said DIN rail in a tightly joined state; and
    an elastic element is positioned between said base frame and said sliding plate to drive said sliding plate to reset to said first position.

2. The DIN rail installation kit as claimed in claim 1, wherein said main body further comprises two side panels respectively located at two opposite lateral sides of said base frame; said first buckle means comprising a transverse slot located on said side panel and an upper hook downwardly curved from a top side of each said transverse slot for hooking on said first flange of said DIN rail.

3. The DIN rail installation kit as claimed in claim 1, wherein said main body further comprises a mounting structure, said mounting structure comprising a locating plate inwardly extended from said base frame and an upper hooking plate upwardly extended from said locating plate; said spring hook further comprises a mounting part located at an opposing top end of said swing arm and combined with said locating plate.

4. The DIN rail installation kit as claimed in claim 3, wherein said main body further comprises an anti-slip structure located on said base frame above said mounting structure, said anti-slip structure comprising two pressing plates inwardly extended from said base frame.

5. The DIN rail installation kit as claimed in claim 3, wherein said main body further comprises said anti-slip structure located on said base frame above said mounting structure, said anti-slip structure comprising a stud provided on said base frame and an elastic body affixed to said stud with a screw.

6. The DIN rail installation kit as claimed in claim 3, wherein said mounting structure of said main body further comprises said upper hooking plate upwardly extended from said locating plate; said latch fastener further comprises a positioning means made in the form of a gusset and provided on said sliding plate; said elastic element comprises two hook rings respectively located at two opposite ends thereof and respectively fastened to said upper hooking plate of said mounting structure and said gusset of said positioning means.

7. The DIN rail installation kit as claimed in claim 1, wherein said hook end of said hook body comprises an oblique arm protruding from a bottom end of said swing arm, and a barbed tail extending downward from a distal end of said oblique arm for a distance and then curved backwards; said buckle portion protrudes laterally from one side of said oblique arm and defines an inclined pushing surface on an outer surface thereof.

8. The DIN rail installation kit as claimed in claim 1, wherein said buckle of said latch fastener comprises a vertical section inwardly extended from said sliding plate, an inclined section obliquely upwardly extended from said vertical section toward an adjacent side wall of said sliding plate, and a stop point defined in a V-shaped included angle formed between said vertical section and said inclined section; when said latch fastener is displaced to said second position, said inclined section of said buckle first pushes down on said buckle portion of said hook body, said swing arm swings toward said adjacent side wall, said buckle passes to below said buckle portion, and said swing arm automatically rebounds so that said hook body is temporarily positioned on said adjacent side wall with said barbed tail of said hook end, and then said latch fastener is released and moved upward by said elastic element, and at the same time said stop point of said buckle is buckled on said buckle portion of said hook body.

9. The DIN rail installation kit as claimed in claim 1, wherein said sliding plate comprises two side walls respectively extended from two opposite lateral sides thereof; said second buckle means comprises a protruding lower stopping block located on each said side wall of said sliding plate for stopping against said second flange of said DIN rail.

10. The DIN rail installation kit as claimed in claim 1, wherein said sliding plate of said latch fastener comprises a plurality of longitudinal sliding slots, and a plurality of guide posts respectively inserted through said longitudinal sliding slots and fastened to said base frame of said main body.

11. The DIN rail installation kit as claimed in claim 1, wherein said latch fastener further comprises a handle downwardly extended from a bottom end of said sliding plate and provided with a plug hole.

12. A DIN rail installation kit operation method, said DIN rail installation kit being used to install an electronic device on a DIN rail or quickly disassemble said electronic device from said DIN rail, said DIN rail installation kit comprising a main body, a spring hook, a latch fastener and an elastic element combined with said electronic device, said latch fastener being pullable twice to move between a first position and a second position, the DIN rail installation kit operation method comprising the steps of, wherein:
    (S101) the user pulls down said latch fastener for the first time to move from said first position to said second position, a buckle of said latch fastener pushes down on a buckle portion of a hook body of said spring hook and deflects said hook body toward an adjacent side wall of said latch fastener, and then said buckle passes to below said buckle portion, said spring hook automatically rebounds so that a hook end of said hook body is temporarily positioned on said adjacent side wall of said latch fastener;
    (S102) the user releases said latch fastener and uses said elastic element to drive said latch fastener upward, said buckle is then buckled on said buckle portion of said hook body, and a second buckle means of said latch fastener is kept away from a first buckle means of said main body to present said DIN rail installation kit in a removable state;

(S103) the user pulls down said latch fastener secondarily, said buckle is separated from said buckle portion of said hook body, and said spring hook rebounds automatically; and (S104) the user releases said latch fastener, said latch fastener is reset to said first position by said elastic element, and at the same time said second buckle means of said latch fastener and said first buckle means of said main body relatively buckled on said DIN rail to exhibit a state of tight coupling.

* * * * *